(12) United States Patent
Huang et al.

(10) Patent No.: US 11,751,342 B2
(45) Date of Patent: Sep. 5, 2023

(54) DISPLAY DEVICE

(71) Applicant: Innolux Corporation, Miao-Li County (TW)

(72) Inventors: Yu-Chia Huang, Miao-Li County (TW); Tsung-Han Tsai, Miao-Li County (TW); Kuan-Feng Lee, Miao-Li County (TW); Jin Yi Tan, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/326,350

(22) Filed: May 21, 2021

(65) Prior Publication Data

US 2021/0392760 A1 Dec. 16, 2021

(30) Foreign Application Priority Data

Jun. 15, 2020 (CN) .......................... 202010541754.3

(51) Int. Cl.
*H05K 5/00* (2006.01)
(52) U.S. Cl.
CPC ................. *H05K 5/0017* (2013.01)
(58) Field of Classification Search
USPC .................. 361/807, 728, 809, 810
See application file for complete search history.

(56) References Cited

U.S. PATENT DOCUMENTS

| | | | |
|---|---|---|---|
| 2014/0009400 A1* | 1/2014 | Poorter | G06F 3/04164 345/173 |
| 2014/0312486 A1* | 10/2014 | Lee | H01L 23/36 257/713 |
| 2016/0268524 A1* | 9/2016 | Suzuki | H01L 51/5246 |
| 2016/0268542 A1* | 9/2016 | Suzuki | H01L 51/0097 |
| 2018/0033837 A1 | 2/2018 | Bok et al. | |
| 2018/0164622 A1* | 6/2018 | Ono | G02F 1/136286 |
| 2019/0179204 A1 | 6/2019 | Bang et al. | |
| 2019/0384433 A1* | 12/2019 | Tang | G06F 3/0445 |
| 2019/0385971 A1* | 12/2019 | Omori | H01L 21/67092 |
| 2020/0077518 A1* | 3/2020 | Kim | H05K 1/189 |
| 2021/0076494 A1* | 3/2021 | Xu | H05K 1/189 |
| 2021/0181918 A1* | 6/2021 | Wu | G06F 1/1641 |

FOREIGN PATENT DOCUMENTS

| | | |
|---|---|---|
| CN | 103529578 | 1/2014 |
| CN | 109901330 | 6/2019 |

OTHER PUBLICATIONS

"Office Action of China Counterpart Application", dated Dec. 2, 2022, p. 1-p. 8.

* cited by examiner

*Primary Examiner* — Hung S. Bui
(74) *Attorney, Agent, or Firm* — JCIPRNET (57) ABSTRACT

A display device includes a display panel and a transparency control panel. The display panel includes a first bonding area. The transparency control panel is disposed below the display panel and includes a second bonding area. The first bonding area is not shielded by the transparency control panel, and the second bonding area is not shielded by the display panel.

18 Claims, 10 Drawing Sheets

DISPLAY DEVICE

CROSS-REFERENCE TO RELATED APPLICATION

This application claims the priority benefit of China application serial no. 202010541754.3, filed on Jun. 15, 2020. The entirety of the above-mentioned patent application is hereby incorporated by reference herein and made a part of this specification.

BACKGROUND OF THE DISCLOSURE

1. Field of the Disclosure

The disclosure relates to an electronic device, particularly to a dual cell display device.

2. Description of Related Art

A dual cell display device is generally spliced from an upper cell and a lower cell by an adhesive layer. If the height of components in a bonding area in the lower cell is greater than the height of components in other areas (that is, the components in the bonding area are more protruding than the components in the other areas), the bonding area is liable to deform due to stress during pairing. In order to meet the demand for thinner display devices, the thickness of the cell is getting smaller and smaller, resulting the problem of insufficient space height at the bonding area and limited material or space design.

SUMMARY OF THE DISCLOSURE

The disclosure provides a display device which can ameliorate the problem of insufficient space height at the bonding area.

According to embodiments of the disclosure, the display device includes a display panel and a transparency control panel. The display panel includes a first bonding area. The transparency control panel is disposed below the display panel and includes a second bonding area. The first bonding area is not shielded by the transparency control panel, and the second bonding area is not shielded by the display panel.

To make the features and advantages of the disclosure clear and easy to understand, the following gives a detailed description of embodiments with reference to accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The disclosure may be understood with reference to the following detailed description and the accompanying drawings. It should be noted that, for ease of understanding by readers and concise drawings, a plurality of drawings in the disclosure merely show a part of an electronic device/display device, and specific elements in the drawings are not drawn to scale. In addition, the quantity and size of the elements in the drawings are merely exemplary, and are not intended to limit the scope of the disclosure. For example, the relative sizes, thicknesses and positions of films, regions or structures may be reduced or enlarged for clarity.

Some words are used to refer to specific elements in the whole specification and the appended claims in the disclosure. A person skilled in the art should understand that an electronic device manufacturer may use different names to refer to the same elements. This specification is not intended to distinguish elements that have the same functions but different names. In this specification and the claims, words such as "have" and "include" are open words, and should be interpreted as "including, but not limited to".

The directional terms mentioned herein, like "above", "below", "front", "back", "left", and "right", refer to the directions in the accompanying drawings. Therefore, the directional terms are only used for illustration instead of limiting the disclosure. It should be understood that, when an element or a film is referred to as being "on" another element or film or "connected to" another element or film, the element or film may be directly on the another element or film or directly connected to the another element or film, or there is an element or a film (indirectly connected) inserted between the two elements or films. Conversely, when an element or a film is referred to as being "directly on" another element or film or "directly connected to" another element or film, there is no element or film inserted between the two elements or films.

The term "about", "equal to", "the same as", "substantially", "roughly", "approximately" or "close to" referred to herein generally represents falling within 10% of a given value or range, or represents falling within 5%, 3%, 2%, 1% or 0.5% of a given value or range. In addition, phrases "a given range is a first value to a second value" and "a given range falls within a range of a first value to a second value" both mean that the given range includes the first value, the second value, and other values between the first value and the second value.

In some embodiments of the disclosure, terms such as "connect" and "interconnect" with regard to bonding and connection, unless specifically defined, may mean that two structures are in direct contact, or may mean that two structures are not in direct contact, and there is another structure between the two structures. The terms with regard to bonding and connection may also include a case where both structures are movable or both structures are fixed. In addition, the terms "electrical connection" and "coupling" include any direct and indirect means of electrical connection.

In the following embodiments, same or similar reference numerals are used to indicate same or similar elements, and details may be omitted in the description. In addition, the features in the embodiments may be used in any combination without departing from the spirit of the disclosure or conflicting with each other, and simple equivalent changes and modifications made to the specification or the claims shall still fall within the scope of the disclosure. In addition, the terms "first", "second", and the like mentioned in the specification or the claims are used only to name different elements or to distinguish between different embodiments or ranges, but are not intended to define the upper or lower limit of the number of elements or the manufacturing or arrangement order of the elements.

The electronic device of the disclosure may include a display device, an antenna device, a sensing device, a light emitting device or a splicing device, but is not limited thereto. The electronic device may include a bendable or flexible electronic device. The electronic device may include, for example, a liquid crystal layer or a light emitting diode. The light emitting diode may include, for example, an organic light emitting diode (OLED), a mini light emitting diode (mini LED), a micro light emitting diode (micro LED) or a quantum dot light emitting diode (quantum dot LED, which may include a QLED and a QDLED), fluorescence, phosphor or other suitable materials, or a combination of the above, but is not limited thereto. A display device will be used below as the electronic device to describe the content of the disclosure, but the disclosure is not limited thereto.

Figure 1:
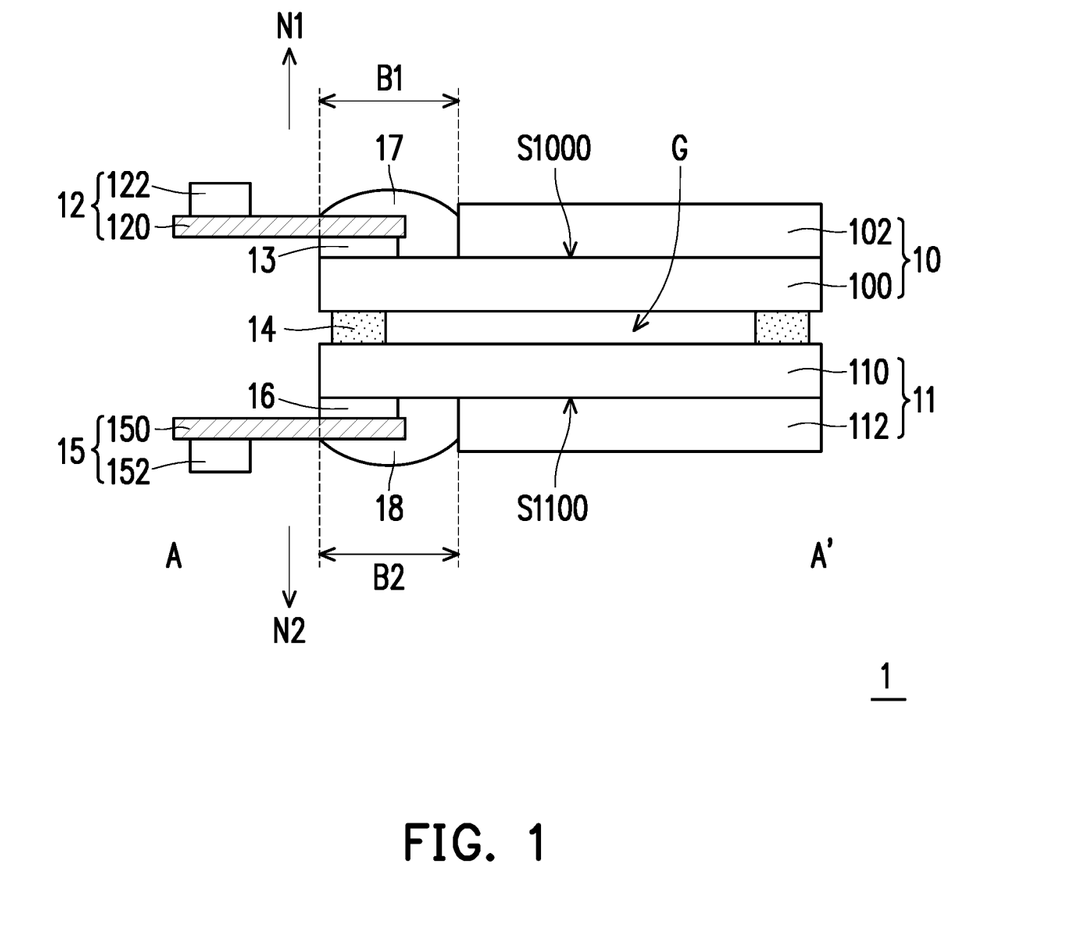
FIG. 1 and FIG. 2 are respectively a schematic cross-sectional view and a schematic three-dimensional view of a display device according to a first embodiment of the disclosure.
Figure 2:
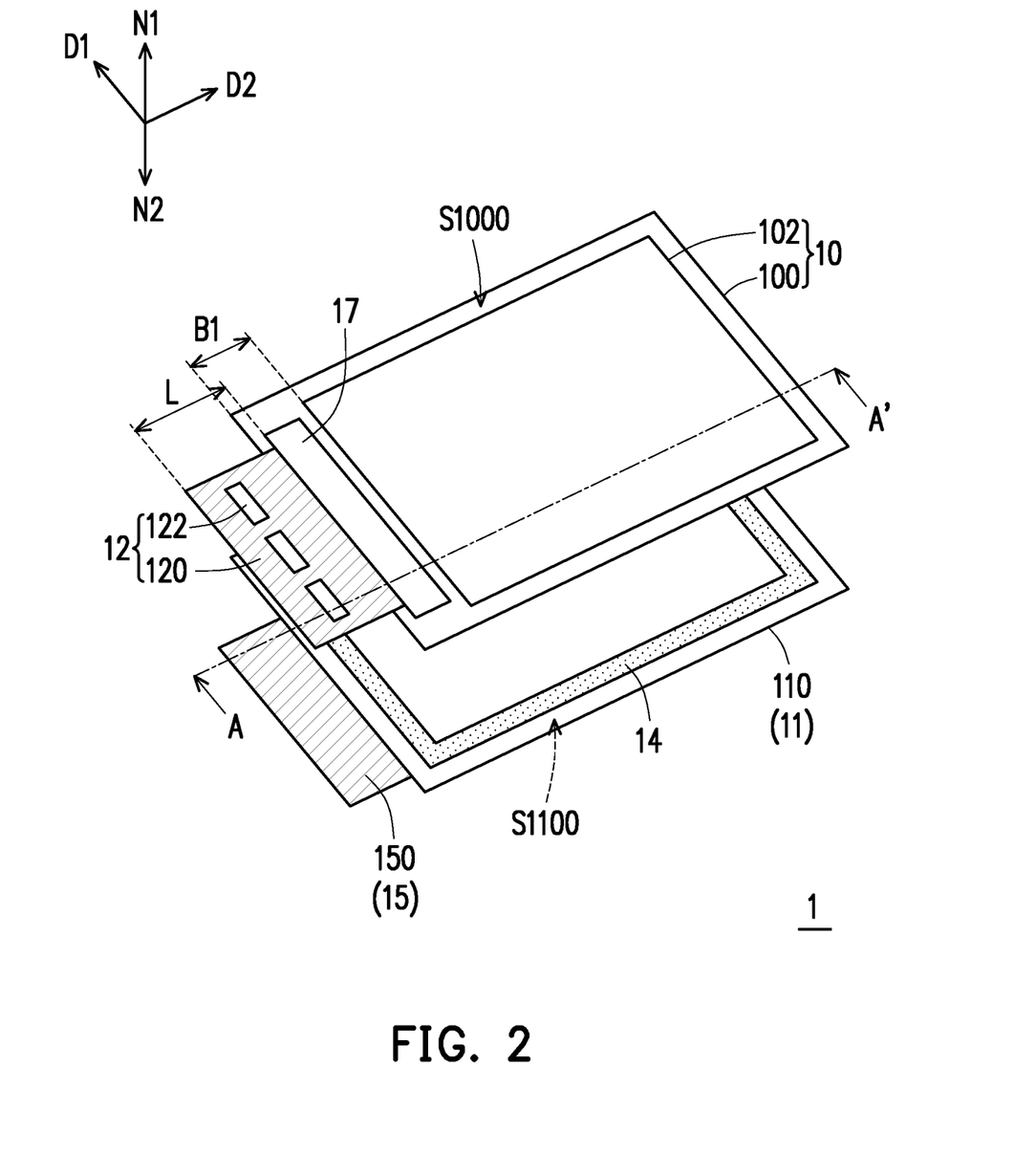

FIG. 1 and FIG. 2 are respectively a schematic cross-sectional view and a schematic three-dimensional view of a display device 1 according to a first embodiment of the disclosure, where the schematic cross-sectional view shown in FIG. 1 corresponds to the cross-sectional line A-A' of FIG. 2. Referring to FIG. 1 and FIG. 2, the display device 1 may include a display panel 10 and a transparency control panel 11.

The display panel 10 may be any type of display panel, such as a self-luminous display panel or a non-self-luminous display panel. The self-luminous display panel may include a light emitting diode, a light conversion layer or other suitable materials, or a combination of the above, but not is limited thereto. The light emitting diode may include, for example, an organic light emitting diode (OLED), a mini light emitting diode (mini LED), a micro light emitting diode (micro LED) or a quantum dot light emitting diode (quantum dot LED, which may include a QLED and a QDLED), but is not limited thereto. The light conversion layer may include a wavelength conversion material and/or a light filter material. The light conversion layer may include, for example, fluorescence, phosphor, quantum dots (QDs), other suitable materials or a combination of the above, but is not limited thereto. The non-self-luminous display panel may include a liquid crystal display panel, but is not limited thereto.

The display panel 10 may include a first substrate 100 and a second substrate 102. The first substrate 100 may include a base (not shown) and components (not shown, such as an active component or a display component) or wiring (not shown, such as a signal line) disposed on the base and located between the base and the second substrate 102. The base may be a light-transmitting substrate. In addition, the substrate may be a rigid substrate or a flexible substrate. For example, a material of the base may include glass or plastic, but is not limited thereto. The active component may include a thin film transistor, but is not limited thereto. The display component may include a display unit and an electrode layer. The display unit may include a light emitting diode, a liquid crystal layer or electrophoretic particles, but is not limited thereto. The electrode layer may include a light-transmitting electrode layer or a non-light-transmitting electrode layer. The light-transmitting electrode layer may be formed of a light-transmitting conductive material or composed of a metal mesh, but is not limited thereto. The non-light-transmitting electrode layer may be formed of a metal, an alloy or a combination thereof, but is not limited thereto. The signal line may include a scanning line, a data line or a power line, but is not limited thereto. The second substrate 102 is disposed on the first substrate 100. The second substrate 102 may include a base (not shown). The base may be a light-transmitting substrate. In addition, the substrate may be a rigid substrate or a flexible substrate. For example, a material of the base may include glass or plastic, but is not limited thereto. In some embodiments, for example, In the architecture where the display panel 10 is a liquid crystal display panel, the second substrate 102 may further include a light filter layer (not shown, such as a color filter array) or an electrode layer (not shown). In some alternative embodiments, the light filter layer or the electrode layer may also be formed on the base of the first substrate 100.

The display panel 10 includes a first bonding area B1. The first bonding area B1 is located on one side of the first substrate 100 and is not covered by the second substrate 102, so as to facilitate bonding of the first bonding area B1 and components thereon (such as a flexible circuit board 12). For example, the flexible circuit board 12 may be electrically connected to wiring (not shown, such as a pad) in the first bonding area B1 through a conductive adhesive layer 13. The conductive adhesive layer 13 may include an anisotropic conductive film (ACF), but is not limited thereto. The flexible circuit board 12 may include a circuit board 120 and one or more integrated circuits 122. The one or more integrated circuits 122 (three integrated circuits 122 are schematically shown in FIG. 2) are disposed on the circuit board 120 and electrically connected to the wiring in the first bonding area B1 through the conductive adhesive layer 13.

In some embodiments, the display device 1 may further include an encapsulation layer 17. The encapsulation layer 17 is disposed in the first bonding area B1 and covers the circuit board 120 located in the first bonding area B1 and the conductive adhesive layer 13 to provide a fixing or water and oxygen resisting effect.

The transparency control panel 11 is provided below the display panel 10. For example, the display panel 10 may be attached to the transparency control panel 11 through an adhesive layer 14. A material of the adhesive layer 14 may include a UV adhesive, a pressure sensitive adhesive (PSA), an optically clear adhesive (OCA) or an optical clear resin (OCR), but is not limited thereto. In some embodiments, the adhesive layer 14 may be a frame-type adhesive layer. For example, the adhesive layer 14 may be arranged along a periphery of the display panel 10 or the transparency control panel 11, and the display panel 10, the transparency control panel 11 and the adhesive layer 14 together define a gap G therebetween. The gap G may or may not be filled with an additional light transmission medium. In the case where the gap G is not filled with the additional light transmission medium, the gap G may be an air gap, but is not limited thereto.

The transparency control panel 11 may, for example, have a transparent state and a nontransparent state (or a dark state) or a transparent state and an atomized state (or a scattered state), and the transparency control panel 11 may, for example, switch between the transparent state and the nontransparent state by the control of an electrical signal, or may switch between the transparent state and the atomized state. The transparency control panel 11 may include a first substrate 110, a second substrate 112 and a transparency adjustment layer (not shown). The first substrate 110 may include a base (not shown) and components (not shown, such as an active component or an electrode layer) or wiring (not shown, such as a signal line) disposed on the base and located between the base and the second substrate 112. For the characteristics, types or materials of the base, the active component, the electrode layer and the signal line, reference may be made to the above, and details will not be repeated here. The second substrate 112 is disposed on the first substrate 110. The second substrate 112 may include a substrate (not shown) and another electrode layer (not shown) or wiring (not shown, such as a signal line) disposed on the base and located between the base and the first substrate 110. The transparency adjustment layer is located between the electrode layer of the first substrate 110 and the electrode layer of the second substrate 112. For example, the transparency adjustment layer may include a dye liquid crystal, a polymer-dispersed liquid crystal (PDLC), a polymer network liquid crystal (PNLC), a cholesterol liquid crystal, an electrochromic (EC) material and a suspended particle device (SPD), but is not limited thereto.

The transparency control panel 11 includes a second bonding area B2. The second bonding area B2 is defined as being on one side of the first substrate 110 and is not covered by the second substrate 112, so as to facilitate bonding of the second bonding area B2 and wiring thereon (such as a flexible circuit board 15). For example, the flexible circuit board 15 may be electrically connected to the wiring (not shown, such as a pad) in the second bonding area B2 through a conductive adhesive layer 16. The conductive adhesive layer 16 may include an anisotropic conductive film, but is not limited thereto. The flexible circuit board 15 may include a circuit board 150 and one or more integrated circuits 152. The one or more integrated circuits 152 are disposed on the circuit board 150 and electrically connected to the wiring in the second bonding area B2 through the conductive adhesive layer 16.

In some embodiments, the display device 1 may further include an encapsulation layer 18. The encapsulation layer 18 is disposed in the second bonding area B2 and covers the circuit board 150 located in the second bonding area B2 and the conductive adhesive layer 16 to provide a fixing or water and oxygen resisting effect.

In some embodiments, bonding surfaces of the first bonding area B1 and the second bonding area B2, for example, for bonding the circuit board 12, may be disposed in opposite directions. Specifically, in the first bonding area B1, a surface of the first substrate 100 facing the flexible circuit board 12 (such as an inner surface S1000 of the first substrate 100) faces a direction N1 (for example, regarded as a bonding direction of the display panel 10), in the second bonding area B2, a surface of the first substrate 110 facing the flexible circuit board 15 (such as an inner surface S1100 of the first substrate 110) faces a direction N2 (for example, regarded as a bonding direction of the transparency control panel 11), and the direction N1 is opposite to the direction N2. Since the first bonding area B1 and the second bonding area B2 face the opposite directions, the first bonding area B1 may not be shielded by the transparency control panel 11 and the second bonding area B2 may not be shielded by the display panel 10, thereby facilitating bonding of other components and the first bonding area B1 or the second bonding area B2.

Herein, "the first bonding area B1 is not shielded by the transparency control panel 11" means that the first bonding area B1 is not shielded or covered by the transparency control panel 11 in the direction N1, so that when the other components (such as the flexible circuit board 12 and the encapsulation layer 17) are bonded to the first bonding area B1, the disposition of the other components (such as the flexible circuit board 12 and the encapsulation layer 17) is not limited to the transparency control panel 11. Similarly, "the second bonding area B2 is not shielded by the display panel 10" means that the second bonding area B2 is not shielded or covered by the display panel 10 in the direction N2, so that when the other components (such as the flexible circuit board 15 and the encapsulation layer 18) are bonded to the second bonding area B2, the disposition of the other components (such as the flexible circuit board 15 and the encapsulation layer 18) is not limited to the display panel 10.

In the architecture where the first bonding area B1 and the second bonding area B2 face the opposite directions, the first bonding area B1 is not covered by the transparency control panel 11 in the direction N1 so that bonding of the other components (the flexible circuit board 12, the conductive adhesive layer 13 or the like) on the first bonding area B1 is not limited to the transparency control panel 11, the second bonding area B2 is not shielded by the display panel 10 in the direction N2 either so that bonding of the other components (the flexible circuit board 15, the conductive adhesive layer 16 or the like) on the second bonding area B2 is not limited to the display panel 10, and therefore, in some embodiments, the first bonding area B1 may overlap the second bonding area B2 in the top view direction of the display device 1 (referring to FIG. 2). With this design, a length L of the flexible circuit board 12 in the direction D2 on a bonding side of the display device 1 can be reduced according to needs, so that the display device 1 has greater design flexibility in appearance or size. In some embodiments, a plurality of integrated circuits 122 may be further disposed in the first bonding area B1, which may further reduce the length L of the flexible circuit board 12 in the direction D2.

In some embodiments, the adhesive layer 14 may be at least partially disposed between the first bonding area B1 and the second bonding area B2, that is, the adhesive layer 14 overlaps the first bonding area B1 and the second bonding area B2 in the direction N1, so as to improve the overall structural strength or reduce the damage or crack caused by impact of external force on the components in the bonding area. In a traditional dual cell display device, an adhesive layer bonded between an upper cell and a lower cell is disposed in a display area, so that the range of the display area is limited to the layout area or position of the adhesive layer. In contrast, in the present embodiment, since the bonding surface of the first bonding area B1 (such as the inner surface S1000 of the first substrate 100) and the bonding surface of the second bonding area B2 (such as the inner surface S1100 of the first substrate 110) face the opposite directions (such as the direction N1 and the direction N2), the range of the display area (not shown) of the display panel 10 may not be limited to the layout area or position of the adhesive layer 14, so the display area of the display panel 10 can be enlarged, which helps to realize the design of a narrow bezel.

Figure 3:
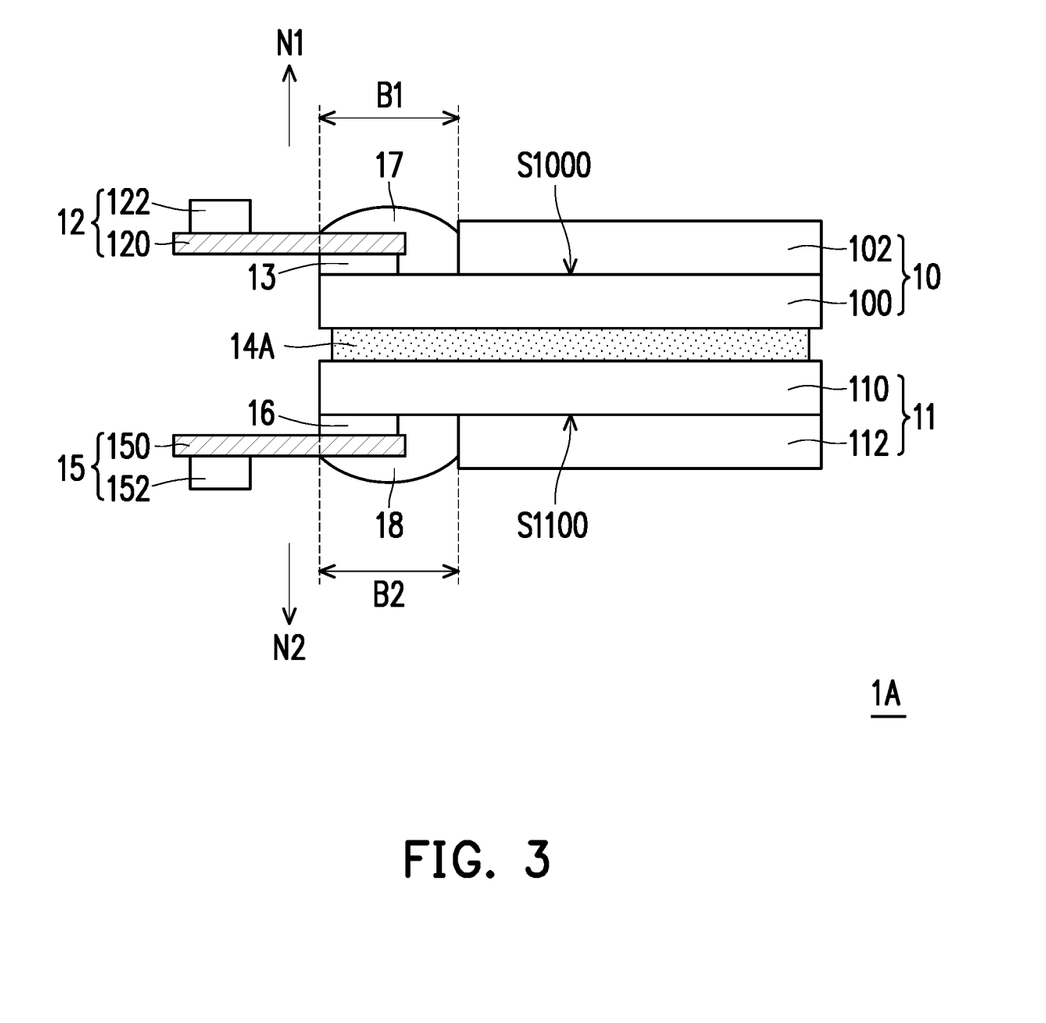
FIG. 3 is a schematic cross-sectional view of a display device according to a second embodiment of the disclosure.

FIG. 3 is a schematic cross-sectional view of a display device 1A according to a second embodiment of the disclosure. Referring to FIG. 3, the main differences between the display device 1A and the display device 1 of FIG. 1 are as follows. In the display device 1A, an adhesive layer 14A is, for example, disposed between the display panel 10 and the transparency control panel 11 as a whole surface. In some embodiments, a refractive index of the adhesive layer 14A may be close to or equal to a refractive index of a substrate (not shown, such as the substrate in the first substrate 100) near the adhesive layer 14A in the display panel 10 and a refractive index of a substrate (not shown, such as the substrate in the first substrate 110) near the adhesive layer 14A in the transparency control panel 11, so as to reduce the interface reflection and improve the light transmittance of the display device 1A. For example, when the substrate is a glass substrate (with a refractive index of 1.5), the refractive index of the adhesive layer 14A may be close to or equal to 1.5.

Figure 4:
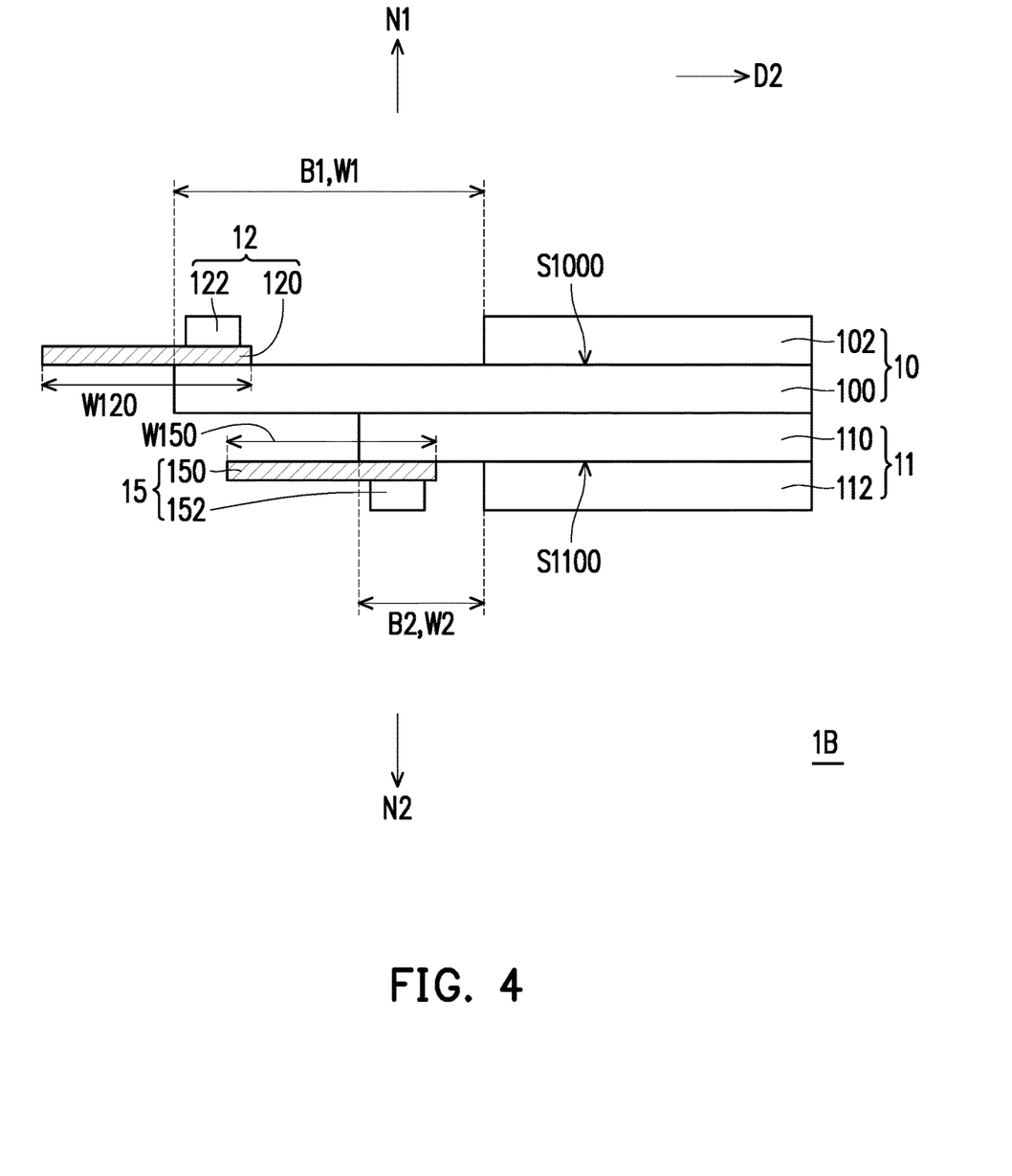
FIG. 4 is a schematic cross-sectional view of a display device according to a third embodiment of the disclosure.

FIG. 4 is a schematic cross-sectional view of a display device 1B according to a third embodiment of the disclosure. Referring to FIG. 4, the main differences between the display device 1B and the display device 1 of FIG. 1 are as follows. In the display device 1B, a size of the first bonding area B1 is larger than a size of the second bonding area B2, for example, a width W1 of the first bonding area B1 in a direction D2 is greater than a width W2 of the second bonding area B2 in a direction D2. The width W1 is a distance in the direction D2 from an edge of the first substrate 100 near the first bonding area B1 to an edge of the second substrate 102 near the first bonding area B1. Similarly, the width W2 is a distance in the direction D2 from an edge of the first substrate 110 near the second bonding area B2 to an edge of the second substrate 112 near the second bonding area B2. In some alternative embodiments, the size of the first bonding area B1 may be less than the size of the second bonding area B2.

With the design of different sizes of the bonding areas, the flexible circuit board 12 and the flexible circuit board 15 can adopt a misaligned design in the direction N1 (or direction N2), that is, the flexible circuit board 12 and the flexible circuit board 15 may not be aligned in the direction N1 (or direction N2). In the bonding process of the flexible circuit board 12 (or flexible circuit board 15), a pressure must be applied to the first substrate 100 (or first substrate 110). The misaligned design can avoid or reduce the damage or harm to the flexible circuit board 15 (or flexible circuit board 12) caused by the pressure. The other embodiments of the disclosure can be modified according to this paragraph and will not be repeated below.

In some embodiments, the integrated circuit 122 may overlap the first bonding area B1 in the top view direction of the display device 1B, and the integrated circuit 152 may overlap the second bonding area B2 in the top view direction of the display device 1B, that is, an orthographic projection of the integrated circuit 122 on the circuit board 120 may be located in the first bonding area B1, and an orthographic projection of the integrated circuit 152 on the circuit board 150 may be located in the second bonding area B2. With the above design, a width W120 of the circuit board 120 in the direction D2 and a width W150 of the circuit board 150 in the direction D2 can be reduced. Thus, the influence on the transparent display effect caused by the circuit board folded back overlapping a light-transmitting area (such as the display area) of the panel can be reduced. In some embodiments, the display device 1B may further include at least one of the conductive adhesive layer 13, the adhesive layer 14 (or the adhesive layer 14A of FIG. 3), the conductive adhesive layer 16, the encapsulation layer 17 and the encapsulation layer 18 of FIG. 1. The encapsulation layer 17 may cover the circuit board 120, the integrated circuit 122 and the conductive adhesive layer 13 in the first bonding area B1. In some embodiments, the encapsulation layer 17 may completely cover the integrated circuit 122 and further cover at least part of the circuit board 120 protruding beyond the first bonding area B1 (referring to FIG. 9). Similarly, the encapsulation layer 18 may cover the circuit board 150, the integrated circuit 152 and the conductive adhesive layer 16 located in the second bonding area B2. In some embodiments, the encapsulation layer 18 may completely cover the integrated circuit 152 and further cover at least part of the circuit board 150 protruding beyond the second bonding area B2 (referring to FIG. 9). In other embodiments, the encapsulation layer 17 (or encapsulation layer 18) may not completely cover the integrated circuit 122 (or integrated circuit 152). The other embodiments of the disclosure can be modified according to this paragraph and will not be repeated below.

Figure 5:
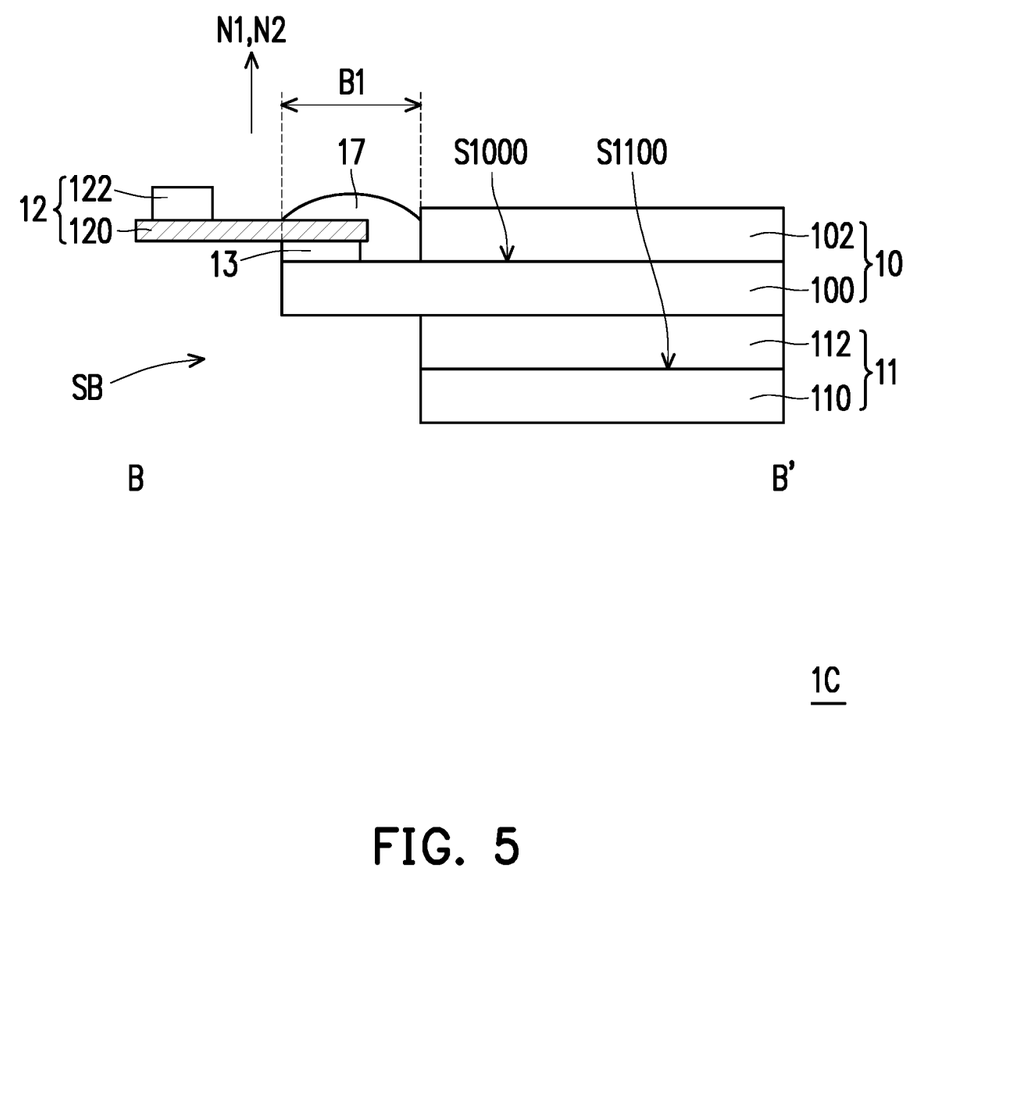
FIG. 5 and FIG. 6 are respectively a schematic cross-sectional view and a schematic three-dimensional view of a display device according to a fourth embodiment of the disclosure.
Figure 6:
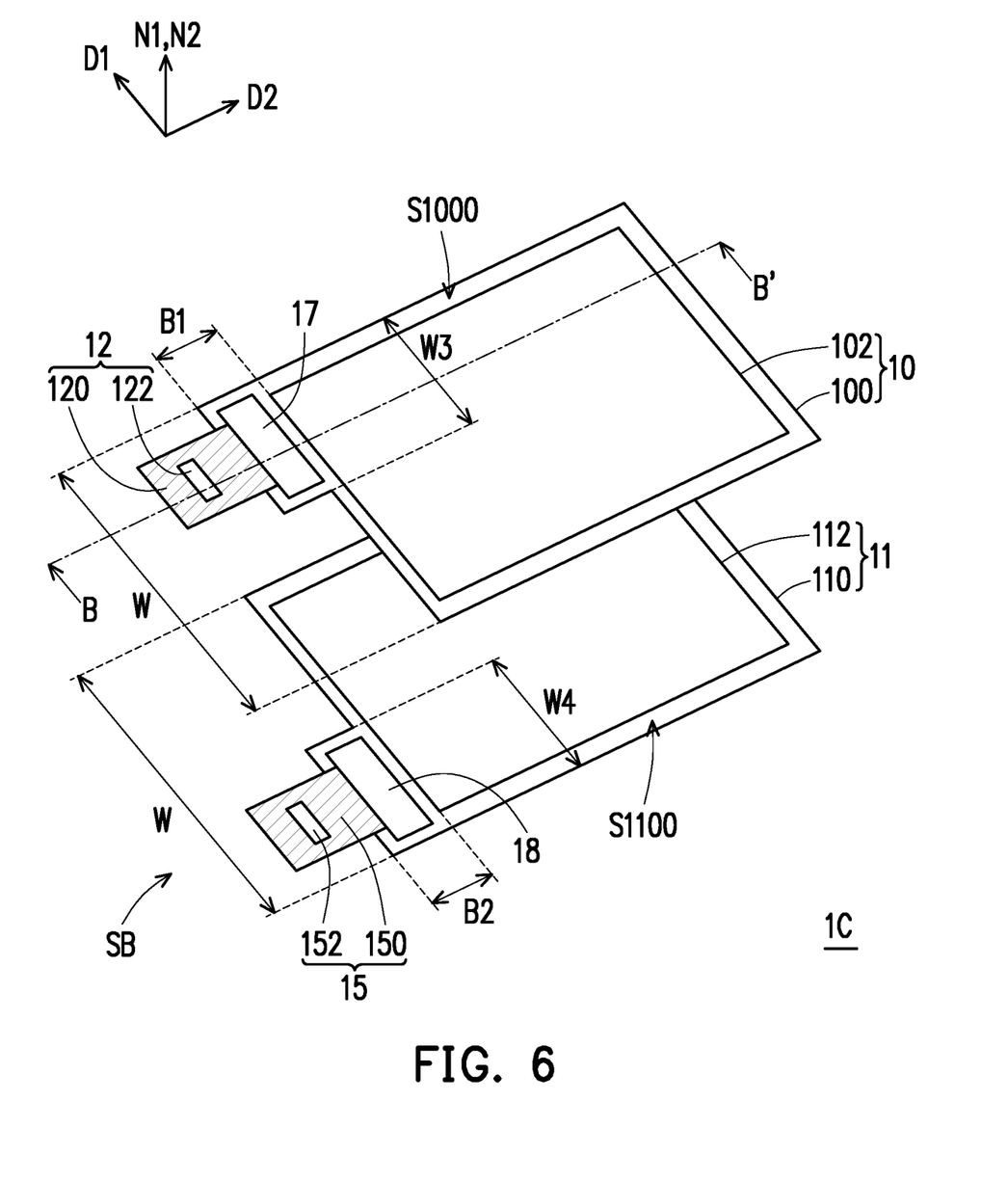

FIG. 5 and FIG. 6 are respectively a schematic cross-sectional view and a schematic three-dimensional view of a display device 1C according to a fourth embodiment of the disclosure, where the schematic cross-sectional view shown in FIG. 5 corresponds to the cross-sectional line B-B' of FIG. 6. Referring to FIG. 5 and FIG. 6, the main differences between the display device 1C and the display device 1 of FIG. 1 and FIG. 2 are as follows. In the display device 1C, the first bonding area B1 and the second bonding area B2 face the same direction, that is, the direction N1 faced by the bonding surface of the first bonding area B1 (such as the inner surface S1000 of the first substrate 100) and the direction N2 faced by the bonding surface of the second bonding area B2 (such as the inner surface S1100 of the first substrate 110) are the same direction. In addition, the first bonding area B1 and the second bonding area B2 are located on the same side of the display device 1C (hereinafter referred to as a bonding side SB). In some embodiments, the first bonding area B1 and the second bonding area B2 may be respectively located at two opposite ends of the bonding side SB. A width W3 and a width W4 of the first bonding area B1 and the second bonding area B2 in the direction D1 are respectively less than a width W of the bonding side SB of the display device 1 in the direction D1, so that the second bonding area B2 is not shielded by the display panel 10. In other embodiments, the first bonding area B1 and/or the second bonding area B2 may be partially shielded, but at least the integrated circuit 122 and/or the integrated circuit 152 are/is not shielded.

It should be noted that, in the architecture where the first bonding area B1 and the second bonding area B2 face the same direction, due to the process errors, alignment accuracy, other conditions or design requirements or the like, the display panel 10 slightly shields or covers the second bonding area B2 in the direction N2, but the case that the second bonding area B2 still has sufficient space to be bonded with other components still falls within the scope covered by "the second bonding area B2 is not shielded by the display panel 10".

In addition, due to the viewing angle, FIG. 5 and FIG. 6 do not show the conductive adhesive layer 16 (referring to FIG. 1) between the circuit board 150 and the first substrate 110, but the display device 1C may include the conductive adhesive layer 16. Secondly, the display device 1B may further include the adhesive layer 14 of FIG. 1 or the adhesive layer 14A of FIG. 2. Furthermore, although FIG. 6 schematically shows one integrated circuit 122 and one integrated circuit 152, the number of integrated circuits in the flexible circuit board 12 and the flexible circuit board 15 can be changed according to needs.

Figure 7:
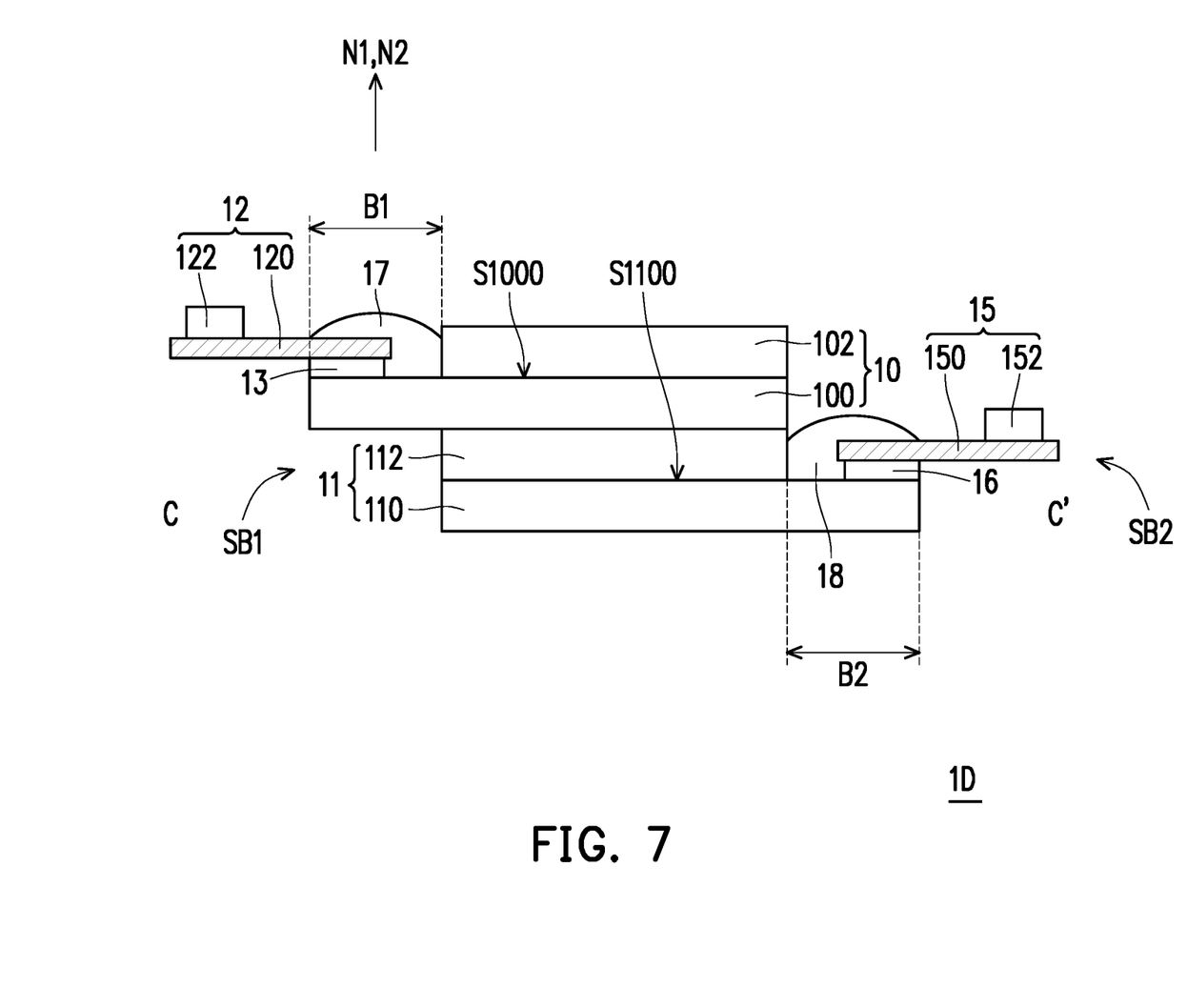
FIG. 7 and FIG. 8 are respectively a schematic cross-sectional view and a schematic three-dimensional view of a display device according to a fifth embodiment of the disclosure.
Figure 8:
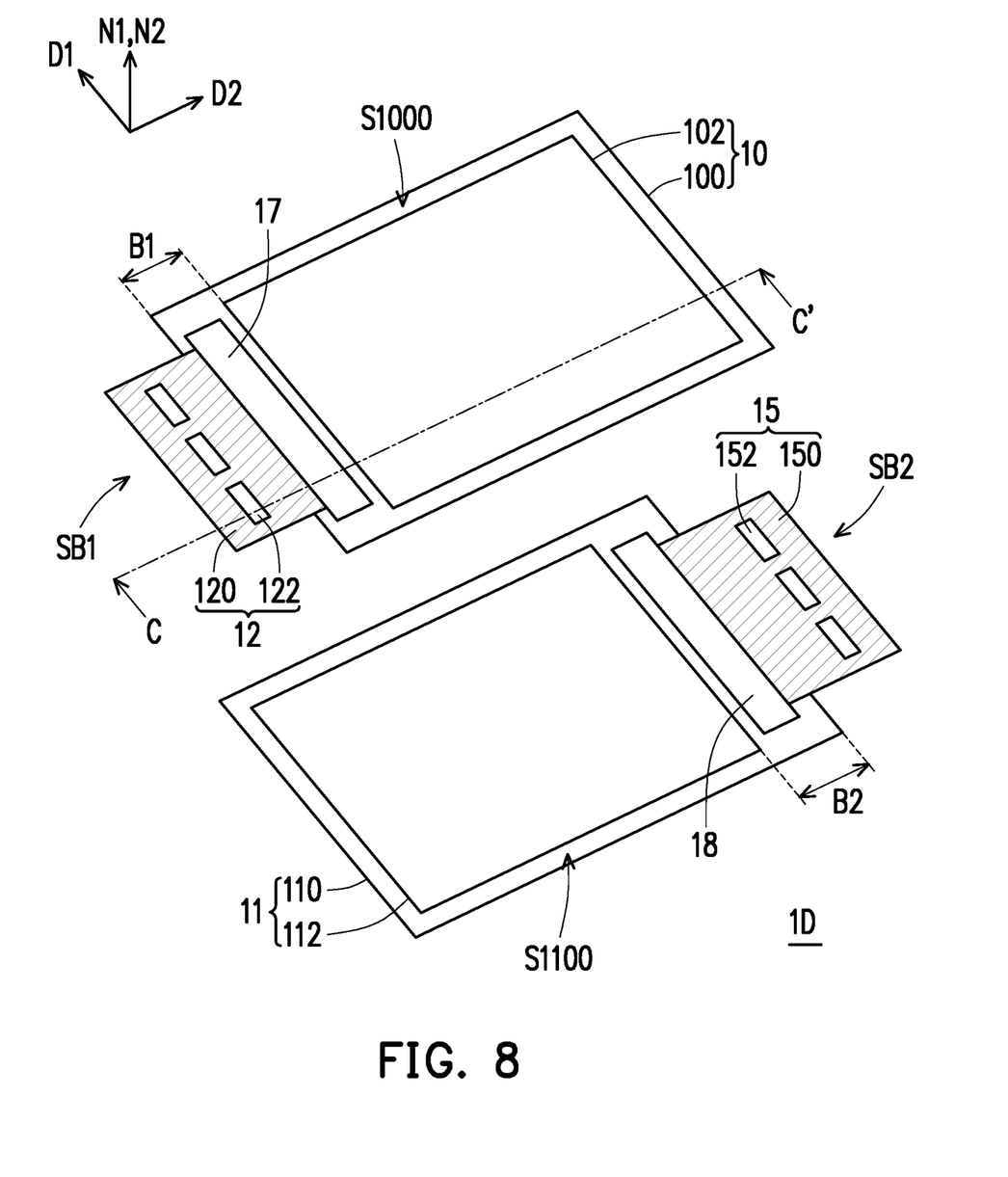

FIG. 7 and FIG. 8 are respectively a schematic cross-sectional view and a schematic three-dimensional view of a display device 1D according to a fifth embodiment of the disclosure, where the schematic cross-sectional view shown in FIG. 7 corresponds to the cross-sectional line C-C' of FIG. 8. Referring to FIG. 7 and FIG. 8, the main differences between the display device 1D and the display device 1C of FIG. 5 and FIG. 6 are as follows. In the display device 1D, the first bonding area B1 and the second bonding area B2 are located on different sides of the display device 1. In some embodiments, the first bonding area B1 is located on a first bonding side SB1 of the display device 1, the second bonding area B2 is located on a second bonding side SB2 of the display device 1, and the first bonding side SB1 and the second bonding side SB2 are respectively located on opposite sides of the display device 1 (as shown in FIG. 7 and FIG. 8). In some alternative embodiments, the first bonding side SB1 and the second bonding side SB2 may be respectively located on adjacent sides of the display device 1.

Figure 9:
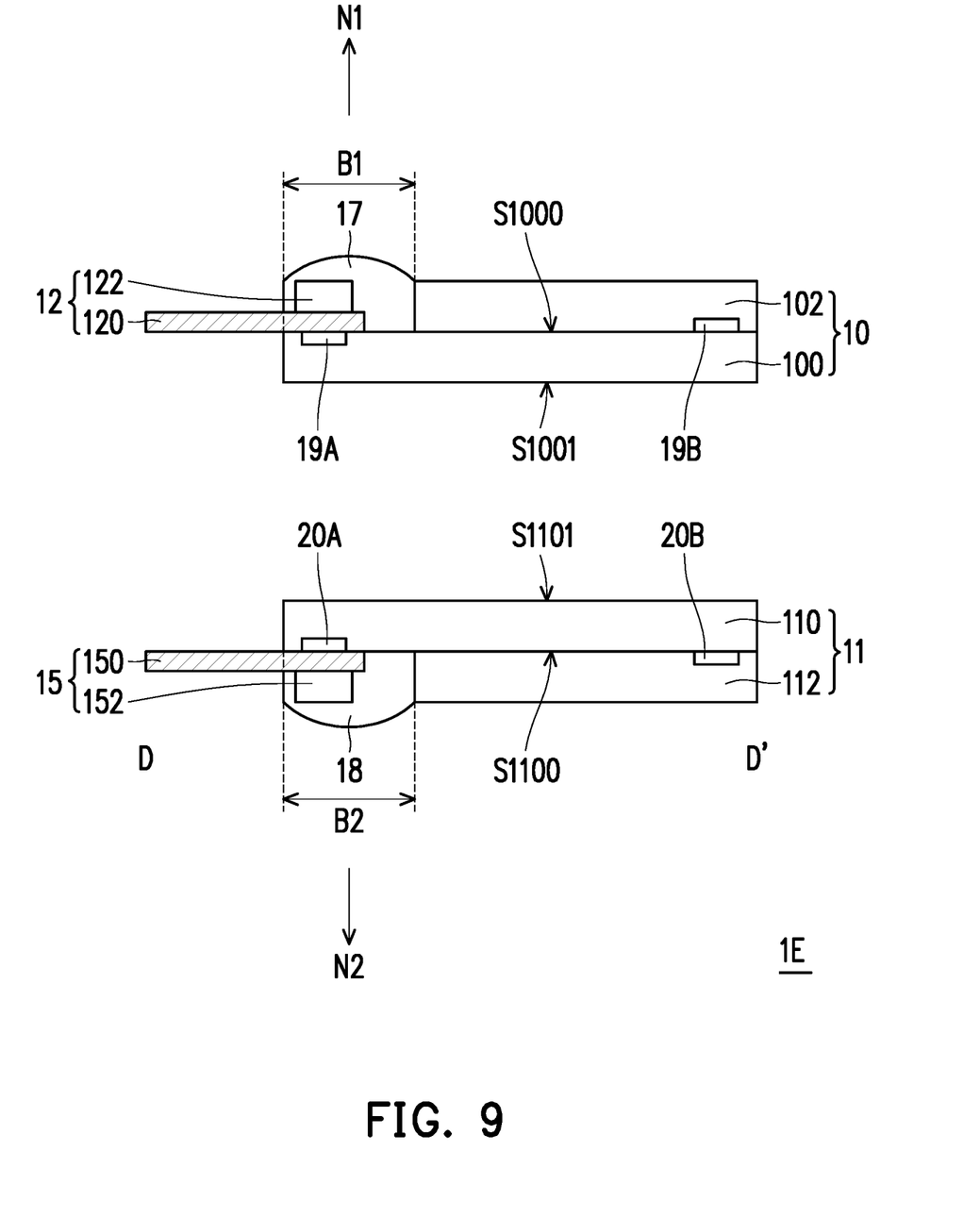
FIG. 9 and FIG. 10 are respectively a schematic cross-sectional view and a schematic three-dimensional view of a display device according to a sixth embodiment of the disclosure.
Figure 10:
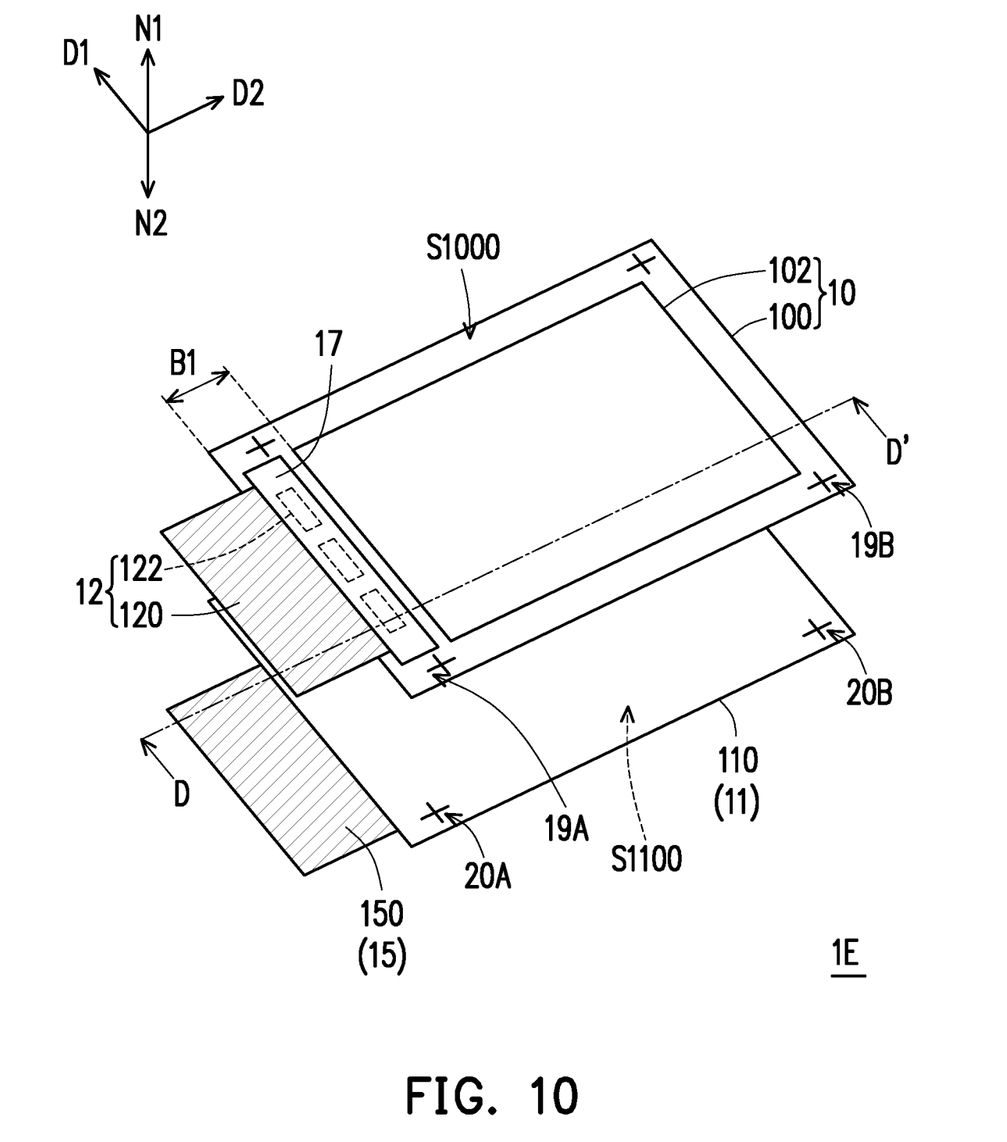

FIG. 9 and FIG. 10 are respectively a schematic cross-sectional view and a schematic three-dimensional view of a display device 1E according to a sixth embodiment of the disclosure, where the schematic cross-sectional view shown in FIG. 9 corresponds to the cross-sectional line D-D' of FIG. 10. Referring to FIG. 9 and FIG. 10, the main differences between the display device 1E and the display device 1 of FIG. 1 and FIG. 2 are as follows. In addition to the display panel 10, the transparency control panel 11, the flexible circuit board 12, the flexible circuit board 15, the encapsulation layer 17 and the encapsulation layer 18, the display device 1E may further include an alignment pattern 19A, an alignment pattern 19B, an alignment pattern 20A and an alignment pattern 20B. The alignment pattern 19A and the alignment pattern 19B are located in the display panel 10, and the alignment pattern 20A and the alignment pattern 20B are located in the transparency control panel 11. The alignment pattern 19A and the alignment pattern 19B overlap the alignment pattern 20A and the alignment pattern 20B in the direction N1 (or direction N2).

In some embodiments, shapes of the alignment pattern 19A and the alignment pattern 19B may be the same as shapes of the alignment pattern 20A and the alignment pattern 20B. In some alternative embodiments, shapes of the alignment pattern 19A and the alignment pattern 19B may be different from shapes of the alignment pattern 20A and the alignment pattern 20B. In some embodiments, the alignment pattern 19A and the alignment pattern 19B may be disposed on the inner surface S1000 of the first substrate 100 (referring to the alignment pattern 19B) or embedded in the inner surface S1000 (referring to the alignment pattern 19A). In some alternative embodiments, the alignment pattern 19A and the alignment pattern 19B may be disposed on the outer surface S1001 of the first substrate 100 or embedded in the outer surface S1001. In some embodiments, the alignment pattern 20A and the alignment pattern 20B may be disposed on the inner surface S1100 of the first substrate 110 (referring to the alignment pattern 20B) or embedded in the inner surface S1100 (referring to the alignment pattern 20A). In some alternative embodiments, the alignment pattern 20A and the alignment pattern 20B may be disposed on the outer surface S1101 of the first substrate 110 or embedded in the outer surface S1101. In some embodiments, the alignment pattern 19A and the alignment pattern 19B may be disposed at four corners of the first substrate 100 (referring to FIG. 11), and the alignment pattern 20A and the alignment pattern 20B may be disposed at four corners of the first substrate 110 (referring to FIG. 11). In some alternative embodiments, the number of the alignment patterns and the disposition positions can be changed according to needs. The other embodiments of the disclosure can be modified according to this paragraph and will not be repeated below. In FIG. 10, the alignment pattern 19A, the alignment pattern 19B, the alignment pattern 20A and the alignment pattern 20B are not actually located on the cross-sectional line D-D'. However, in order make it easier for a reader to understand the relative disposition relationship between the alignment pattern 19A, the alignment pattern 19B and the first substrate 100 and the relative disposition relationship between the alignment pattern 20A, the alignment pattern 20B and the first substrate 110, the alignment pattern 19B, the alignment pattern 20A and the alignment pattern 20B are also shown in FIG. 9.

The alignment pattern disposed on the inner surface of the component substrate (such as the first substrate 100 or the first substrate 110) or embedded in the inner surface can be manufactured together with the wiring on the component substrate, so that the alignment accuracy can be improved without additionally increasing the number of processes. On the other hand, by disposing the alignment pattern on the outer surface of the component substrate or embedded in the outer surface, the distance between the alignment pattern in the display panel 10 and the alignment pattern in the transparency control panel 11 in the direction N1 (or direction N2) can be reduced, thereby improving the alignment accuracy.

In some embodiments, the display device 1E may further include at least one of the conductive adhesive layer 13, the adhesive layer 14 (or the adhesive layer 14A of FIG. 2) and the conductive adhesive layer 16 of FIG. 1.

Based on the above, in the embodiments of the disclosure, since the first bonding area of the display panel is not shielded by the transparency control panel and the second bonding area of the transparency control panel is not shielded by the display panel, when the other components (such as the flexible circuit board) are bonded to the first bonding area (or the second bonding area), they may not be limited to the transparency control panel (or the display panel).

In some embodiments, at least part of the adhesive layer may be disposed between the first bonding area and the second bonding area to improve the overall structural strength or reduce the damage or crack caused by impact of an external force on the components in the bonding area. In some embodiments, the refractive index of the adhesive layer may be close to or equal to the refractive index of the substrate near the adhesive layer in the display panel or the refractive index of the substrate near the adhesive layer in the transparency control panel, so as to reduce the interface reflection and improve the light transmittance of the display device. In some embodiments, the design of different sizes of the bonding areas can be used to avoid or reduce the damage or harm to the flexible circuit board caused by the pressure during bonding. In some embodiments, the design that the integrated circuit overlaps the bonding area can be used to reduce the width of the circuit board, thereby reducing the influence on the transparent display effect caused by the circuit board folded back overlapping the light-transmitting area of the panel. In some embodiments, the disposition of the alignment patterns can be used to improve the alignment accuracy.

The foregoing embodiments are merely used for describing the technical solutions of the disclosure, but are not intended to limit the disclosure. Although the disclosure is described in detail with reference to the foregoing embodiments, a person of ordinary skill in the art should understand that, modifications may still be made to the technical solutions in the foregoing embodiments, or equivalent replacements may be made to some or all of the technical features; and such modifications or replacements will not cause the essence of corresponding technical solutions to depart from the scope of the technical solutions in the embodiments of the disclosure.

Although the embodiments and advantages of the disclosure have been disclosed above, it should be understood that, a person of ordinary skill in the art may make variations, replacements and modifications without departing from the spirit and scope of the disclosure, and features between various embodiments may be arbitrarily mixed and replaced with each other to generate other new embodiments. In addition, the protection scope of the disclosure is not limited to a process, machine, manufacturing, material composition, device, method, and step in a specific embodiment in this specification. A person of ordinary skill in the art may understand the existing or to-be-developed process, machine, manufacturing, material composition, device, method, and step from the content of the disclosure, which may be used according to the disclosure as long as the substantially same function can be implemented or the substantially same result can be obtained in the embodiments described herein. Therefore, the protection scope of the disclosure includes the foregoing process, machine, manufacturing, material composition, device, method, and step. In addition, each claim forms an independent embodiment, and the protection scope of the disclosure also includes a combination of claims and embodiments. The protection scope of the disclosure should be subject to the appended claims.

What is claimed is:

1. A display device, comprising:
    a display panel, comprising a first bonding area;
    a first alignment pattern, located in the first bonding area;
    a transparency control panel, disposed below the display panel and comprising a second bonding area; and
    a second alignment pattern, located in the second bonding area;
    wherein the first bonding area is not shielded by the transparency control panel, and the second bonding area is not shielded by the display panel,
    wherein a width of the first bonding area is different from a width of the second bonding area,
    wherein the display panel and the transparency control panel each comprise a first substrate, and an adhesive layer is disposed between the first substrate of the display panel and the first substrate of the transparency control panel,
    wherein an edge of the adhesive layer is not aligned with at least one of an edge of the first substrate of the display panel and an edge of the first substrate of the transparency control panel.

2. The display device according to claim 1, wherein the first bonding area and the second bonding area face opposite directions.

3. The display device according to claim 2, wherein the first bonding area overlaps the second bonding area in a top view direction of the display device.

4. The display device according to claim 3, wherein the display panel is attached to the transparency control panel by the adhesive layer, and at least part of the adhesive layer is disposed between the first bonding area and the second bonding area.

5. The display device according to claim 1, wherein the first bonding area and the second bonding area face a same direction.

6. The display device according to claim 5, wherein the first bonding area and the second bonding area are located on different sides of the display device.

7. The display device according to claim 5, wherein the first bonding area and the second bonding area are located on a same side of the display device.

8. The display device according to claim 1, wherein at least one of the first bonding area and the second bonding area is bonded to a flexible circuit board, the flexible circuit board comprises an integrated circuit, and the integrated circuit overlaps the at least one of the first bonding area and the second bonding area in a top view direction of the display device.

9. The display device according to claim 1, wherein the width of the first bonding area is greater than the width of the second bonding area.

10. The display device according to claim 1, wherein the first alignment pattern and the second alignment pattern are in the shape of a cross pattern.

11. The display device according to claim 1,
    wherein a refractive index of the adhesive layer is substantially equal to at least one of a refractive index of the first substrate of the display panel and a refractive index of the first substrate of the transparency control panel.

12. The display device according to claim 1, further comprising:
    an encapsulation layer, disposed in the first bonding area, wherein the display panel further comprises a second substrate, and
    encapsulation layer disposed adjacent to the second substrate,
    wherein a height of the encapsulation layer is greater than a height of the second substrate.

13. The display device according to claim 1, further comprising:
    a flexible circuit board, bonded to the first bonding area and comprising an integrated circuit; and
    an encapsulation layer, covering the flexible circuit board and the integrated circuit, wherein the display panel further comprises a second substrate, and the encapsulation layer disposed adjacent to the second substrate,
    wherein the encapsulation layer corresponding to the integrated circuit has a first height, the encapsulation layer near the second substrate has a second height, and the first height is greater than the second height.

14. The display device according to claim 1, further comprising:
    a flexible circuit board, bonded to the first bonding area and comprising an integrated circuit; and
    an encapsulation layer, covering the flexible circuit board and the integrated circuit,
    wherein a surface of the encapsulation layer away from the transparency control panel is a curved surface.

15. The display device according to claim 14, wherein at least one part of the curved surface overlaps the integrated circuit.

16. The display device according to claim 1, further comprising:
    a flexible circuit board, bonded to the first bonding area and comprising an integrated circuit, wherein the first alignment pattern and the second alignment pattern do not overlap the flexible circuit board or the integrated circuit.

17. The display device according to claim 16, wherein the display panel is attached to the transparency control panel by the adhesive layer, and at least a part of the adhesive layer is disposed between the first bonding area and the second bonding area.

18. A display device, comprising:
a display panel, comprising a first bonding area;
a first alignment pattern, located in the first bonding area;
a transparency control panel, disposed below the display panel and comprising a second bonding area; and
a second alignment pattern, located in the second bonding area;
a flexible circuit board, bonded to the first bonding area and comprising an integrated circuit; and
an encapsulation layer, covering the flexible circuit board and the integrated circuit,
wherein the first bonding area is not shielded by the transparency control panel, and the second bonding area is not shielded by the display panel,
wherein a width of the first bonding area is different from a width of the second bonding area,
wherein a surface of the encapsulation layer away from the transparency control panel is a curved surface.

* * * * *